(12) United States Patent
Juanes Ribas et al.

(10) Patent No.: US 10,044,116 B2
(45) Date of Patent: Aug. 7, 2018

(54) ELECTRICAL TERMINAL BLOCK

(71) Applicant: Lear Corporation, Southfield, MI (US)

(72) Inventors: Ferran Juanes Ribas, Valls (ES); Montserrat Piñol Pedret, Valls (ES); Enric Aparicio Rollan, Valls (ES)

(73) Assignee: Lear Corporation, Southfield, MI (US)

( * ) Notice: Subject to any disclaimer, the term of this patent is extended or adjusted under 35 U.S.C. 154(b) by 8 days.

(21) Appl. No.: 15/297,517

(22) Filed: Oct. 19, 2016

(65) Prior Publication Data

US 2017/0117642 A1   Apr. 27, 2017

Related U.S. Application Data

(60) Provisional application No. 62/244,980, filed on Oct. 22, 2015.

(51) Int. Cl.

| | | |
|---|---|---|
| *H01R 9/24* | (2006.01) | |
| *H01R 43/20* | (2006.01) | |
| *H05K 3/30* | (2006.01) | |
| *H01R 12/58* | (2011.01) | |
| *H02G 3/08* | (2006.01) | |
| *H02G 15/06* | (2006.01) | |
| *H01R 43/02* | (2006.01) | |
| *H01R 43/24* | (2006.01) | |
| *H01R 107/00* | (2006.01) | |

(52) U.S. Cl.
CPC ......... *H01R 9/2416* (2013.01); *H01R 12/585* (2013.01); *H01R 43/0256* (2013.01); *H01R 43/205* (2013.01); *H01R 43/24* (2013.01); *H02G 3/081* (2013.01); *H02G 15/06* (2013.01); *H05K 3/30* (2013.01); *H01R 2107/00* (2013.01)

(58) Field of Classification Search
CPC .... H01R 9/2416; H01R 12/585; H01R 43/24; H01R 9/09; H02G 15/06
See application file for complete search history.

(56) References Cited

U.S. PATENT DOCUMENTS

| | | | | |
|---|---|---|---|---|
| 3,209,311 | A * | 9/1965 | Kukla | H01R 13/11 439/851 |
| 3,579,170 | A * | 5/1971 | Baumanis | H01R 23/68 439/329 |
| 6,712,623 | B2 * | 3/2004 | Sumida | B60R 16/0239 174/541 |
| 6,863,543 | B2 * | 3/2005 | Lang | H01R 13/514 439/607.05 |
| 6,995,461 | B2 * | 2/2006 | Soyano | H01L 23/045 257/678 |
| 7,201,587 | B1 * | 4/2007 | Eichorn | H01R 12/724 439/79 |
| 7,857,637 | B2 * | 12/2010 | Kasai | H05K 3/306 439/76.2 |

(Continued)

*Primary Examiner* — William H Mayo, III
*Assistant Examiner* — Hiram E Gonzalez
(74) *Attorney, Agent, or Firm* — Fishman Stewart PLLC

(57) ABSTRACT

An electrical terminal block may include an electrical terminal that may include a first portion configured for connection with a connector and a second portion that may be configured for connection with a circuit board. The terminal block may include a body that may be configured to support the electrical terminal. The terminal block may include a guiding formation that may extend from the body and may be disposed at least partially around the first portion of the electrical terminal.

20 Claims, 10 Drawing Sheets

(56) References Cited

U.S. PATENT DOCUMENTS

| | | | |
|---|---|---|---|
| 2007/0021003 A1* | 1/2007 | Laurx ................. | H01R 13/514 439/607.05 |
| 2015/0044889 A1* | 2/2015 | Wang .................. | H01R 12/707 439/83 |

* cited by examiner

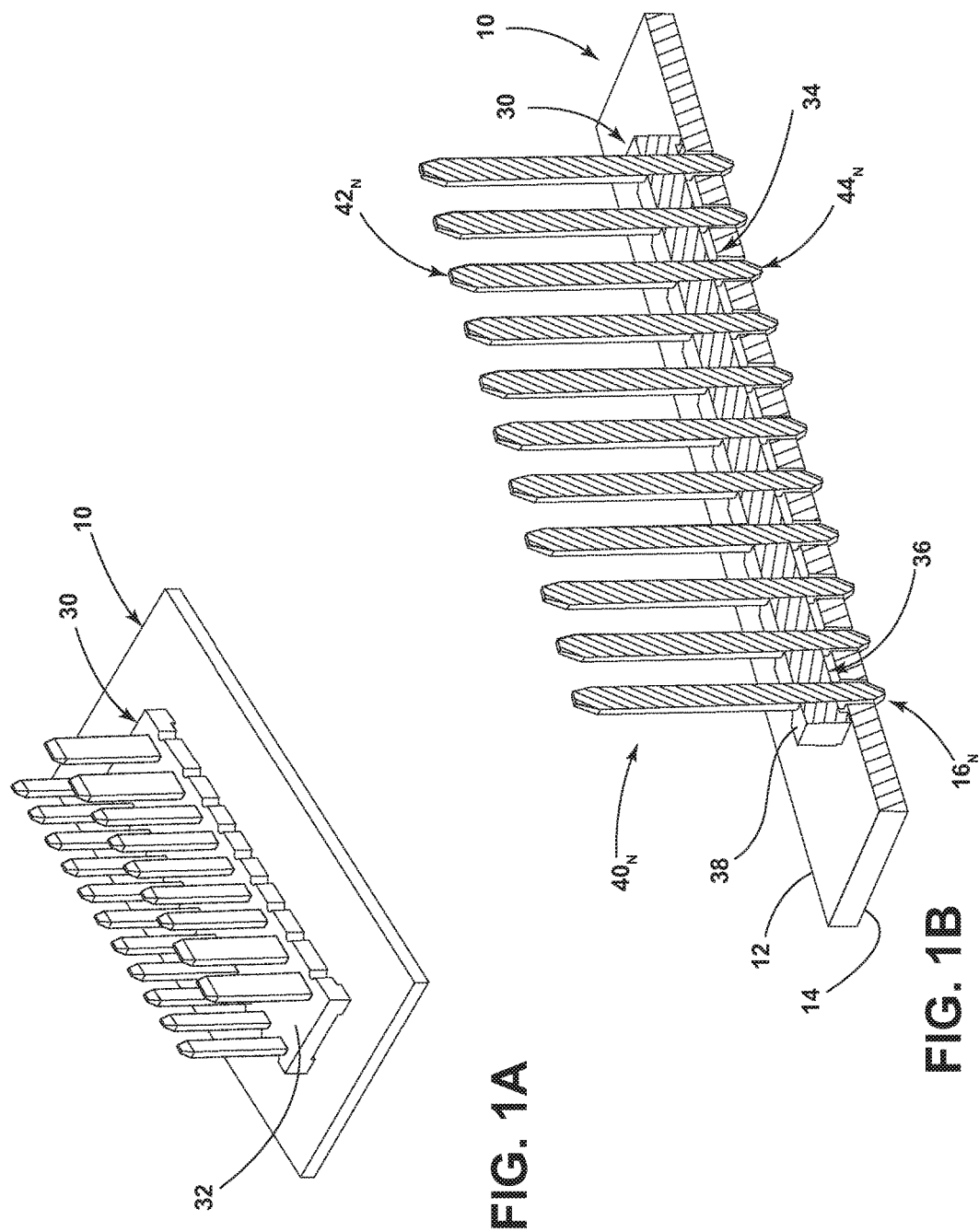

ELECTRICAL TERMINAL BLOCK

CROSS-REFERENCE TO RELATED APPLICATION

This application claims the benefit of U.S. Provisional Application Ser. No. 62/244,980, filed Oct. 22, 2015, the disclosure of which is hereby incorporated herein by reference in its entirety.

TECHNICAL FIELD

The present disclosure relates to electrical components, including electrical connectors, electrical terminals, and/or circuit boards.

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

In some circumstances, terminal blocks may be required to meet relatively strict tolerance requirements. Meeting such strict tolerance requirements with some terminal blocks may be difficult as such terminal blocks may provide relatively limited guidance and/or support for electrical terminals.

There is therefore a desire for solutions/options that minimize or eliminate one or more of the above-described challenges. The foregoing discussion is intended only to illustrate the present field and should not be taken as a disavowal of scope.

SUMMARY

The present disclosure includes an electrical terminal block may include an electrical terminal that may include a first portion configured for connection with a connector and a second portion that may be configured for connection with a circuit board. In embodiments, the terminal block may include a body that may be configured to support the electrical terminal. In embodiments, the terminal block may include a guiding formation that may extend from the body and may be disposed at least partially around the first portion of the electrical terminal. In embodiments, the guiding formation may include a plurality of sides disposed in a pyramid shape, may include a conical shape, may include a cylindrical shape, and/or another desired shape.

In embodiments, an electrical terminal block may comprise an electrical terminal. The electrical terminal may include a first portion that may be configured for connection with a connector and/or a second portion that may be configured for connection with a circuit board. The electrical terminal block may include a body that may be configured to support the electrical terminal. The electrical terminal block may include a guiding formation that may extend from the body and/or may be connected to the electrical terminal. The guiding formation may be disposed at least partially around the first portion of the electrical terminal. The guiding formation may include a plurality of substantially planar sides that may taper toward a top of the electrical terminal. The plurality of substantially planar sides may be configured to contact a junction box housing and/or restrict movement of the first portion of the electrical terminal.

In embodiments, the guiding formation may be disposed at least partially around the second portion of the electrical terminal. The guiding formation may include a substantially conical configuration.

In embodiments, an electrical terminal block may comprise a second electrical terminal and/or a second guiding formation. The second guiding formation may extend from the body and/or may be connected to the electrical terminal. The electrical terminal block may comprise a support beam that may extend from the body and/or may connect the guiding formation and the second guiding formation.

In embodiments, the guiding formation may be an upper guiding formation that may extend from a top of the body. The electrical terminal block may include a plurality of lower guiding formations. The plurality of lower guiding formations may be interconnected via a plurality of support beams. The plurality of support beams may be disposed in substantially rectangular configurations. The electrical terminal block may comprise a plurality of electrical terminals. Each of the plurality of bottom guiding formations may be connected to a respective electrical terminal of the plurality of electrical terminals.

The electrical terminal block may comprise a plurality of upper guiding formations, each upper guiding formation connected to a respective electrical terminal of the plurality of electrical terminals. An electrical junction box may comprise the electrical terminal block and/or a junction box housing. The guiding formation may be in contact with a plurality of separation formations of the junction box housing.

In embodiments, a method of assembling a junction box may comprise providing a junction box housing, providing a circuit board, providing an electrical terminal that may include guiding formations and/or electrical terminals, connecting the electrical terminal block with the circuit board to form a circuit board assembly, and/or connecting the circuit board assembly with the junction box housing. Connecting the circuit board assembly with the junction box housing may include inserting the guiding formations and the electrical terminals into terminal apertures of the junction box housing. The guiding formations may be disposed at a top side of the electrical terminal block. The electrical terminal block may include a plurality of bottom guiding formations that may be disposed at a bottom side of the terminal block and/or may extend toward the circuit board. The electrical terminal block may include a plurality of support beams that may extend downward from the electrical terminal block and/or may connect the bottom guiding formations. At least one of the guiding formations may include a plurality of substantially planar sides that may taper toward a top of a respective electrical terminal. The plurality of sides may contact the junction box housing upon insertion into the terminal apertures. Providing the electrical terminal block may include forming a body of the electrical terminal block and the guiding formations around the electrical terminals to form a single, unitary component.

BRIEF DESCRIPTION OF THE DRAWINGS

FIG. 1A is a perspective view of a terminal block attached to a circuit board.

FIG. 1B is a cross-sectional perspective view of a terminal block attached to a circuit board.

DETAILED DESCRIPTION

Figure 2A:
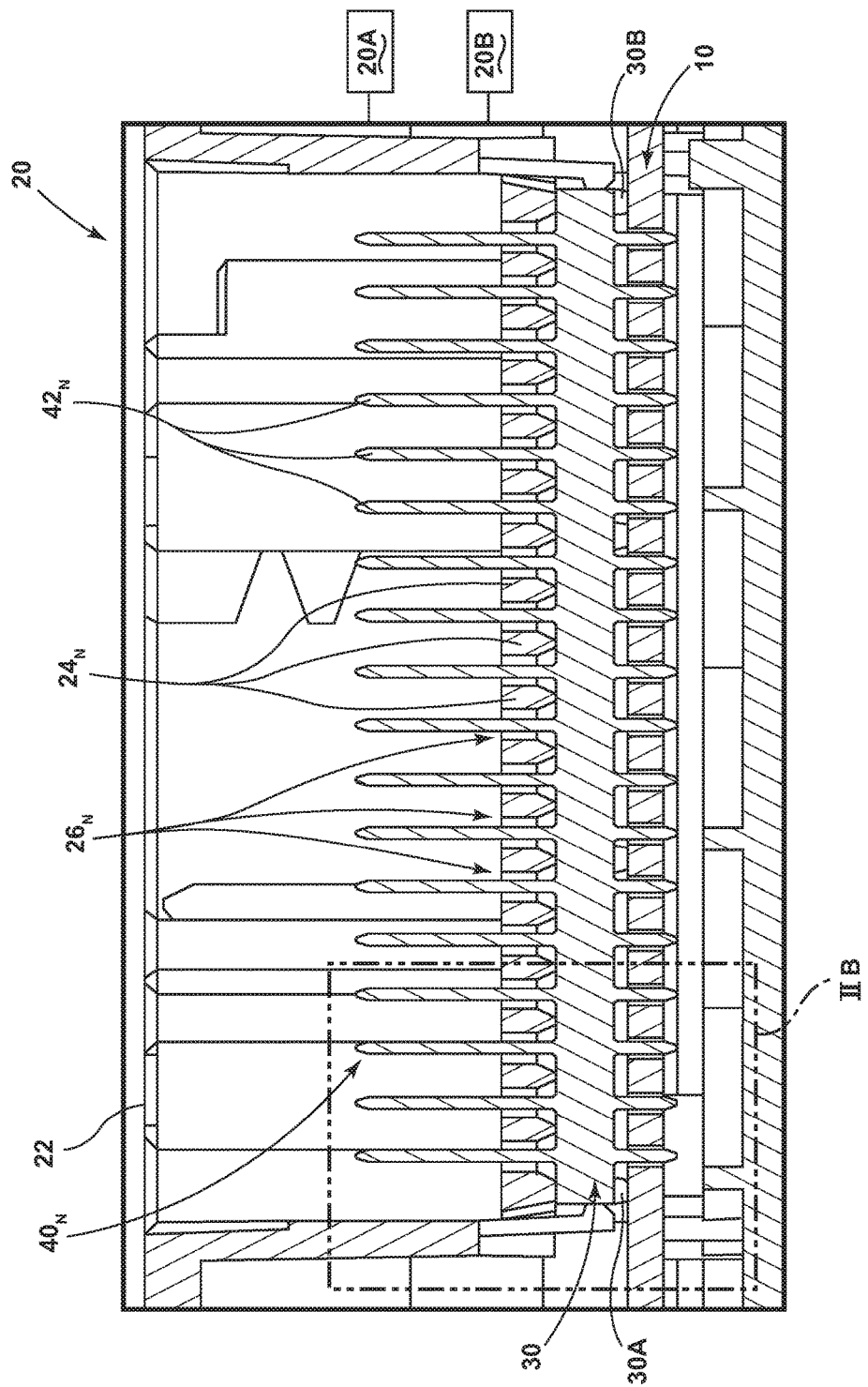
FIG. 2A is a cross-sectional view of an embodiment of a junction box including a terminal block, a circuit board, and a housing.
Figure 2B:
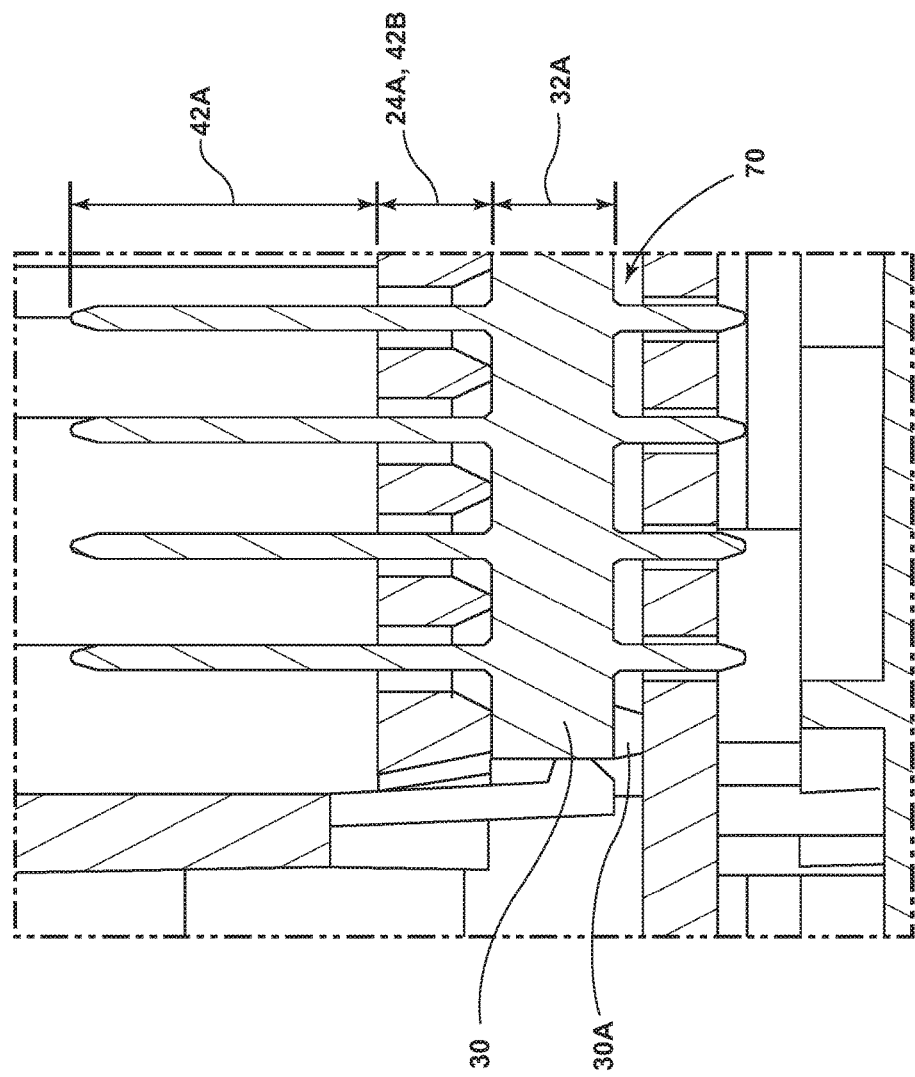
FIG. 2B is an enlarged cross-sectional view of portions of the embodiment of a junction box of FIG. 2A, including a terminal block, a circuit board, and a housing.
Figure 3A:
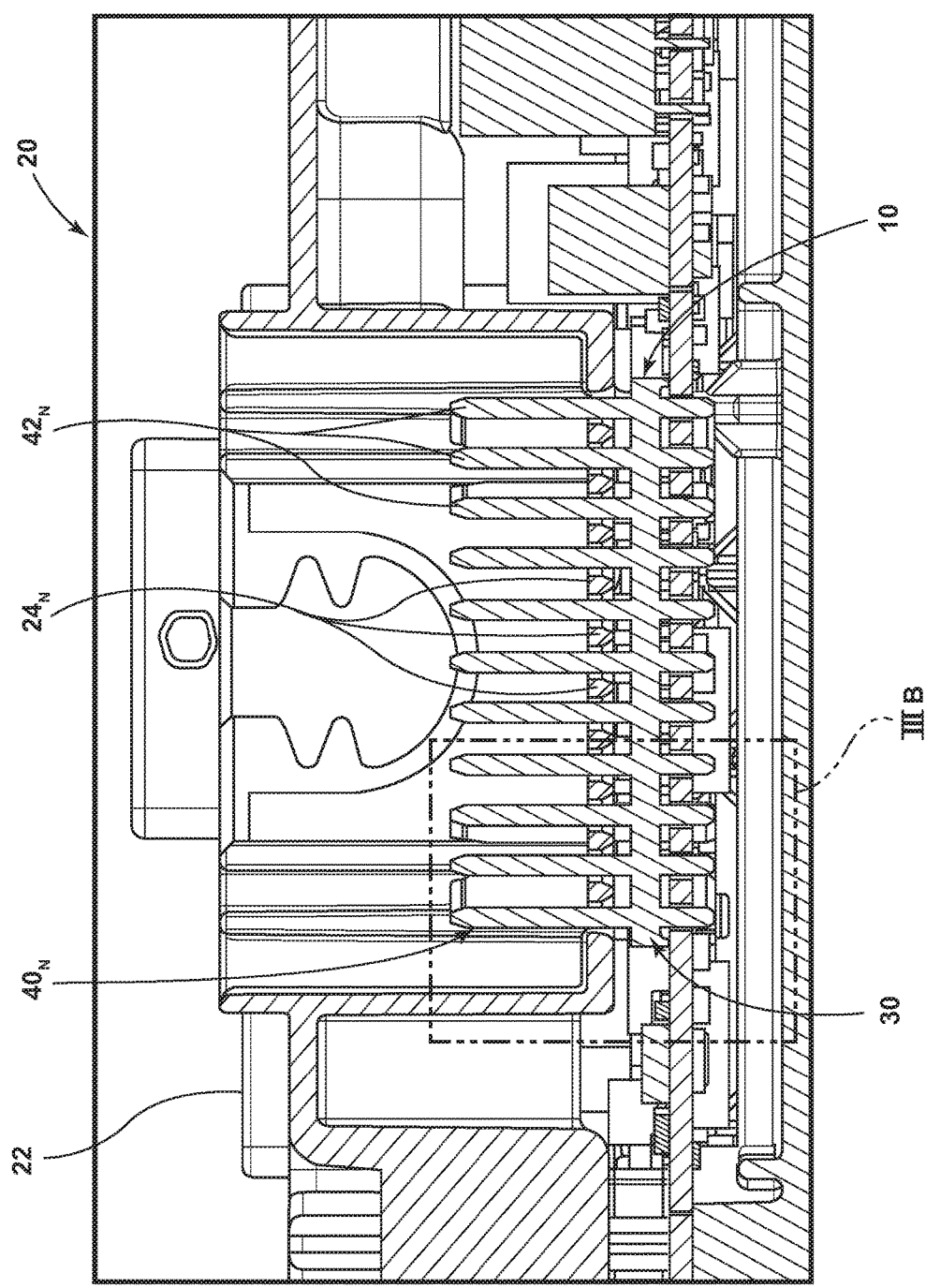
FIG. 3A is a cross-sectional view of an embodiment of a junction box including a terminal block, a circuit board, and a housing.
Figure 3B:
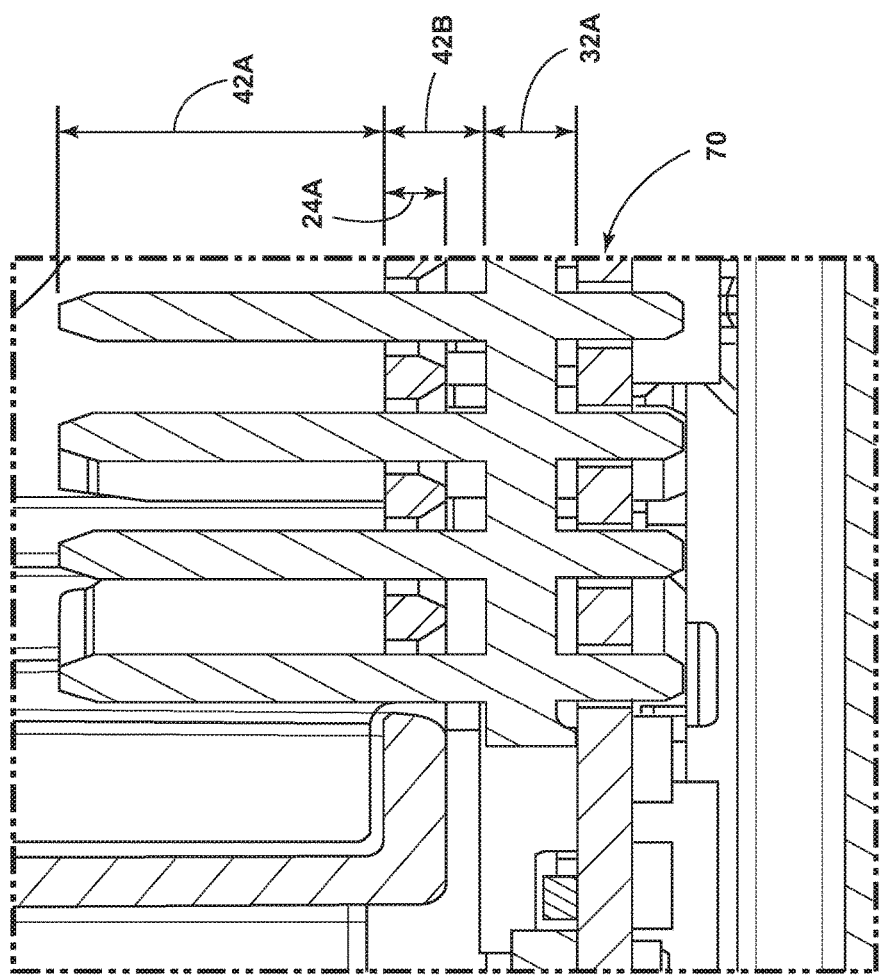
FIG. 3B is an enlarged cross-sectional view of portions of the embodiment of a junction box of FIG. 3A, including a terminal block, a circuit board, and a housing.
Figure 4B:
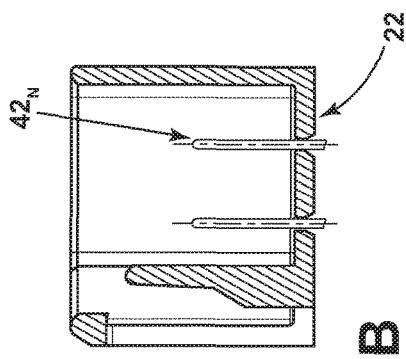
FIGS. 4A, 4B, and 4C are side views of electrical terminals.
Figure 4A:
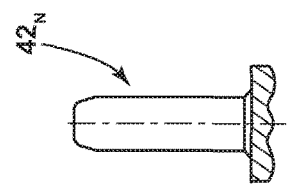
Figure 4C:
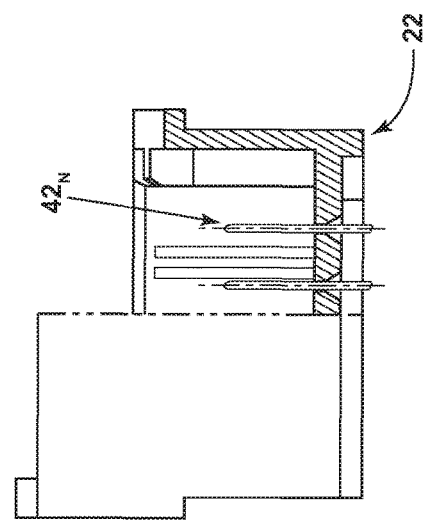

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure as defined by the appended claims.

Referring to the drawings, FIGS. 1A, 1B, 2A 2B, 3A, 3B, 4A, 4B, and 4C generally illustrate a circuit board 10, which may include a printed circuit board (PCB), and a terminal block 30. Terminal block 30 may include a solid body 32 that may support one or more electrical terminals $40_N$ in a particular orientation (e.g., a vertical orientation). Terminal block 30 may include legs 30A, 30B. If terminal block 30 is mounted to circuit board 10, a cavity 34 may be formed between terminal block 30 and circuit board 10.

In embodiments, such as generally illustrated in FIGS. 5A, 5B, 6A, and 6B, a terminal block 50 may be used in connection with circuit board 10 and/or a housing 22 of electrical junction box 20. Terminal block 50 may include a body 52 and body 52 may include a plurality of side walls (e.g., side walls 56A, 56B, 56C, 56D) that may extend perpendicularly from body 52, such as toward circuit board 10. In embodiments, terminal block 50 may include a plurality of feet (e.g., feet 58A, 58B) that may extend (e.g., perpendicularly) from body 52 and/or may extend generally parallel to side walls 56A, 56B, 56C, 56D. Feet 58A, 58B may extend beyond the bottom of the side walls (e.g., side walls 56A, 56B, 56C, 56D) such that if terminal block 50 is disposed on and/or adjacent to circuit board 10, feet 58A, 58B may contact circuit board 10 and bottoms of the side walls 56A, 56B, 56C, 56D may be disposed at a distance from circuit board 10 (e.g., there may be a gap between side walls 56A, 56B, 56C, 56D and circuit board 10 if terminal block 50 is mounted to circuit board 10).

In embodiments, such as generally illustrated in FIGS. 5A, 5B, 6A, and 6B, an electrical terminal (e.g., one or more of electrical terminals $40_N$) may include a first portion $42_N$ that may extend above body 52 (e.g., away from circuit board 10) and/or a second portion $44_N$ that may extend below body 52 (e.g., toward circuit board 10). First portion $42_N$ may be configured for connection with a connector, such as a wiring harness male connector (e.g., with female terminals) that may be used, for example, for a vehicle. In embodiments, first portion $42_N$ may extend (e.g., perpendicularly) to body 52 and may be configured to extend through a portion of a housing 22 and into a connector. In embodiments, first portions $42_N$ may be generally vertical and/or first portions $42_N$ (which may or may not all be the same) may be angled (e.g., may be bent at an angle, such as about 90 degrees, such that one or more of first portions $42_N$ may be generally parallel to body 52).

In embodiments, a second portion $44_N$ of an electrical terminal $40_N$ may be configured for connection with circuit board 10. For example, and without limitation, second portion $44_N$ may extend perpendicularly to body 52 and may extend vertically beyond the bottoms of the feet (e.g., feet 58A, 58B) of body 52 such that second portion $44_N$ may extend into and/or through a corresponding aperture $16_N$ in circuit board 10. In embodiments, second portion $44_N$ may be configured to be attached to and/or electrically connected to circuit board 10, such as via soldering.

Figures 6A, 6B:
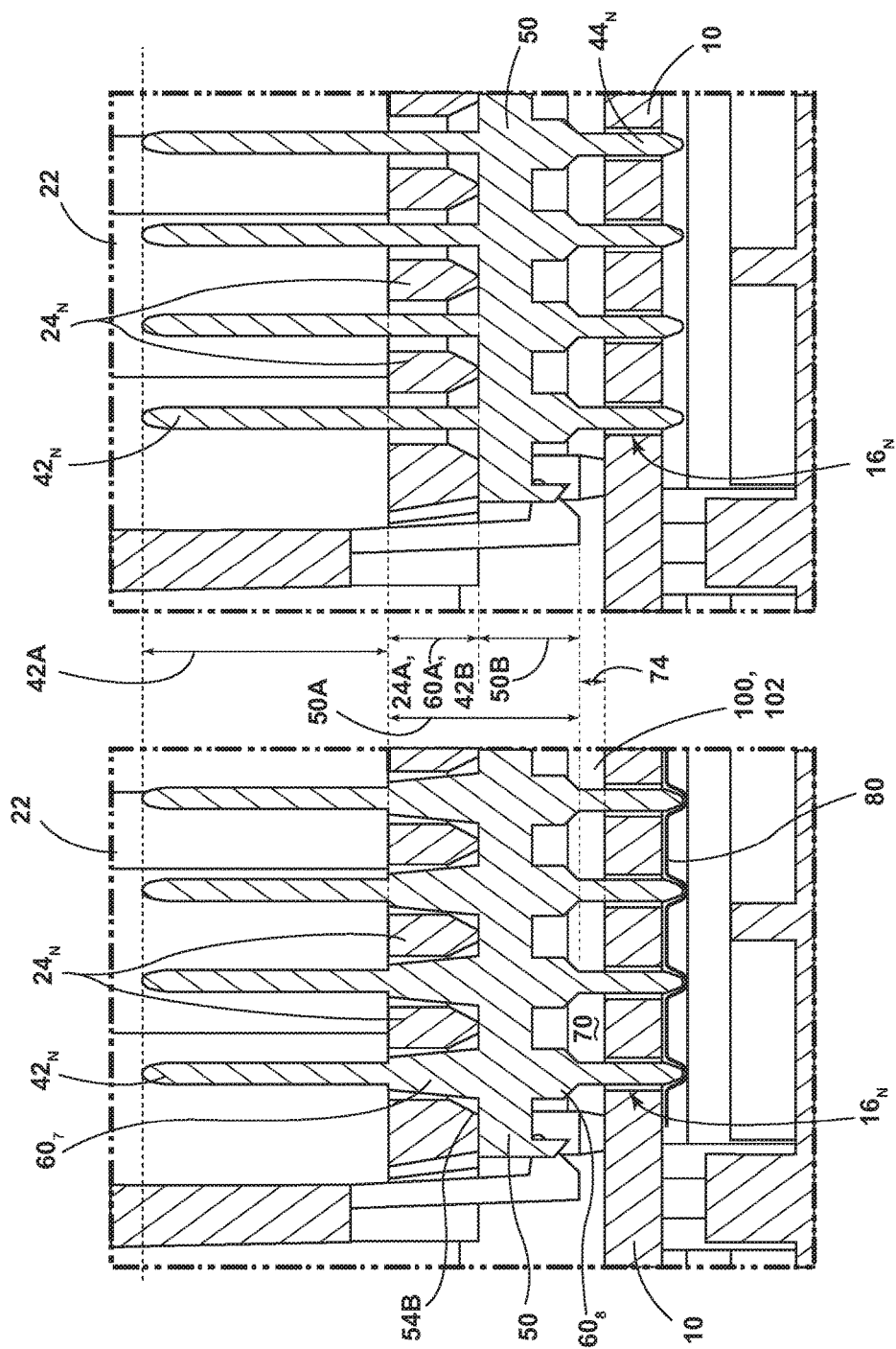
FIG. 6A is a cross-sectional view of an embodiment of a junction box including a terminal block with top and bottom guidance formations, a circuit board, and a housing in accordance with teachings of the present disclosure.
FIG. 6B is a cross-sectional view of an embodiment of a junction box including a terminal block with bottom guidance formations, a circuit board, and a housing in accordance with teachings of the present disclosure.
Figure 7A:
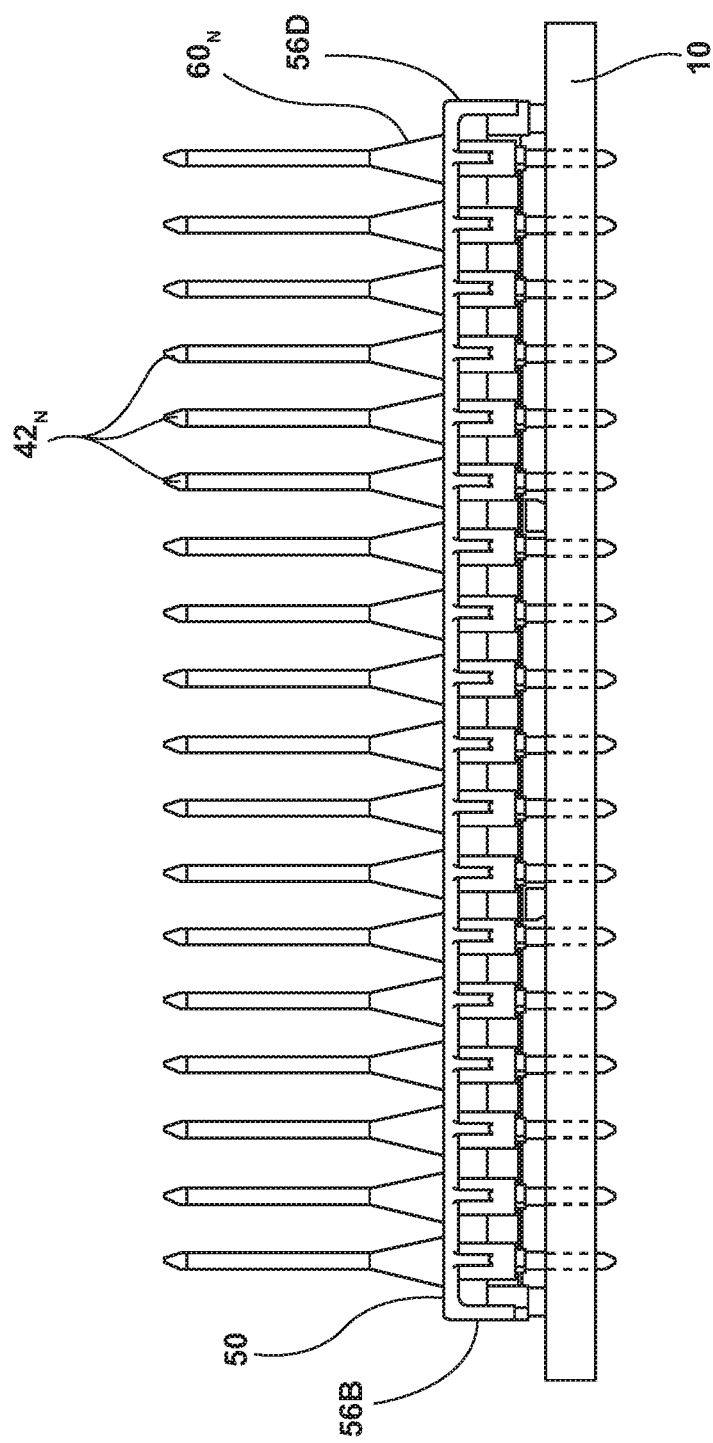
FIG. 7A is a cross-sectional view of an embodiment of a terminal block and a circuit board in accordance with teachings of the present disclosure.
Figure 7B:
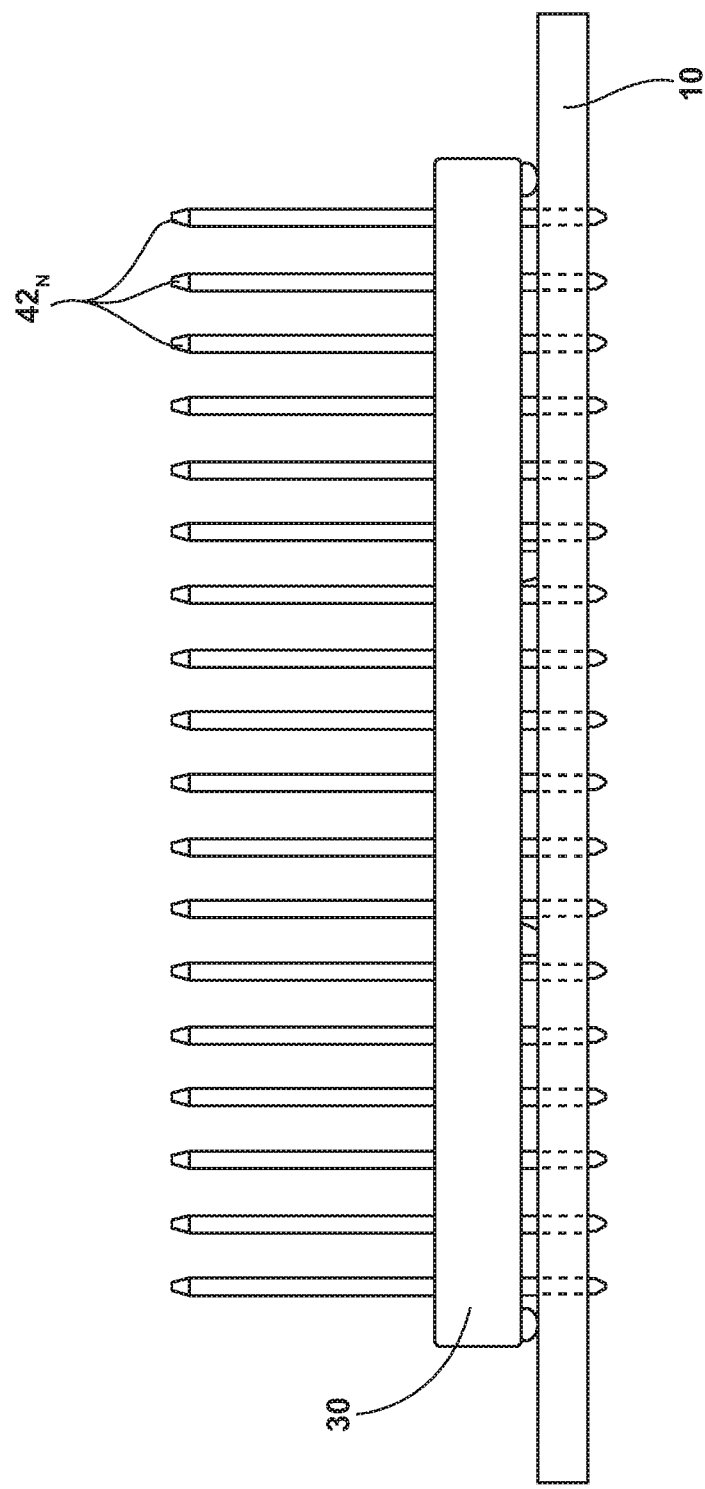
FIG. 7B is a side view of a terminal block attached to a circuit board.

In embodiments, such as generally illustrated in FIGS. 6A, and 6B, terminal blocks (e.g., terminal block 50) may be used in connection with an electrical junction box 20, which may include a terminal block (e.g., block 50) and/or circuit board 10 being disposed in a housing 22 of electrical junction box 20. In embodiments, electrical junction box 20 may include and/or be connected to an electronic control unit (ECU) 20A and/or a power distribution unit (PDU) 20B.

In embodiments, housing 22 may include a plurality of separation formations $24_N$ that may be disposed between one or more of electrical terminals $40_N$, which may include being disposed between first portions $42_N$ of electrical terminals $40_N$. In embodiments, separation formations 24 may define a plurality of apertures $26_N$ into which first portions $42_N$ may be inserted.

In some configurations, such as generally illustrated in FIGS. 2A, 2B, 3A, and 3B, apertures $26_N$ of housing 22 may be larger than first portions $42_N$ such that during insertion of first portions $42_N$ into apertures $26_N$ via terminal block 30, first portions $42_N$ do not contact and/or are not guided in separation formations 24. Additionally, upon complete insertion via terminal block 30, separation formations 24 may be laterally spaced from (e.g., not in contact with) first portions $42_N$.

In embodiments, it may be desirable for terminal blocks (e.g., terminal block 30 and/or terminal block 50) and/or electrical terminals $40_N$ to meet strict tolerances. For example, and without limitation, terminals $42_N$ together with the housing part 22 may form a female connector that may need to comply with strict tolerances in order to ensure proper alignment with a respective male connector, such as a male connector associated with a wiring harness. Meeting strict tolerances with some terminal blocks (e.g., terminal block 30) may be difficult for some applications, as such blocks may not provide sufficient or desired guidance and/or support of electrical terminals $40_N$. For example, and without limitation, first portions $42_N$ of electrical terminals $40_N$ may not be guided or supported by terminal block 30 beyond top surface 38 of body 32. Thus, in embodiments, it may be desirable to provide increased guidance for electrical terminals $40_N$ during insertion into a housing (e.g., into apertures $26_N$ of housing 22) and/or increased support once insertion is complete. In embodiments, a terminal block 50 may be configured for providing additional insertion guidance and/or post-insertion support.

In embodiments, terminal block 50 may include one or more guiding formations $60_N$ that may be configured to guide and/or support electrical terminals $40_N$. In embodiments, guiding formations $60_N$ may include one or more of a variety of shapes, sizes, and/or configurations. For example, and without limitation, one or more guiding formations $60_N$ (e.g., guiding formations $60_1$, $60_2$, $60_3$) may include a shape that generally resembles a pyramid with a base disposed at a surface of body 52 (e.g., upper surface 54B) and that narrows as it extends away from body 52 (see, e.g., FIGS. 5A, 6A, and 6B). In embodiments, guiding formations $60_N$ with a pyramid configuration may include a plurality of sides (e.g., side $62A_N$, $62B_N$, $62C_N$, $62D_N$) that may be angled inward toward an electrical terminal. Sides $62A_N$, $62B_N$, $62C_N$, $62D_N$ may be generally planar and each side may be substantially the same as each other side (e.g., same size, shape, angle, etc.). Sides $62A_N$, $62B_N$, $62C_N$, $62D_N$ may be configured for insertion with first portion $42_N$ into a corresponding aperture defined by separation formations 24 and may increase the effective cross-sectional area of first portion $42_N$ (e.g., if viewed along a vertical axis of first portion $42_N$). In embodiments, sides $62A_N$, $62B_N$, $62C_N$, $62D_N$ may be configured to guide first portion $42_N$ into a corresponding aperture $26_N$. For example, and without limitation, angled sides $62A_N$, $62B_N$, $62C_N$, $62D_N$ may help align (e.g., center) electrical terminal first portion $42_N$ in the corresponding aperture $26_N$. In embodiments, guiding formations $60_N$ may provide at least some support to electrical terminals $40_N$ even after insertion is complete. For example, and without limitation, sides $62A_N$, $62B_N$, $62C_N$, $62D_N$ may be disposed such that they contact separation formations 24 upon insertion and maintain contact with separation formations 24 when insertion is complete, which may limit movement of first portions $42_N$ and keep the positions of first portions $42_N$ within strict (e.g., defined or desired) tolerances.

Figure 5B:
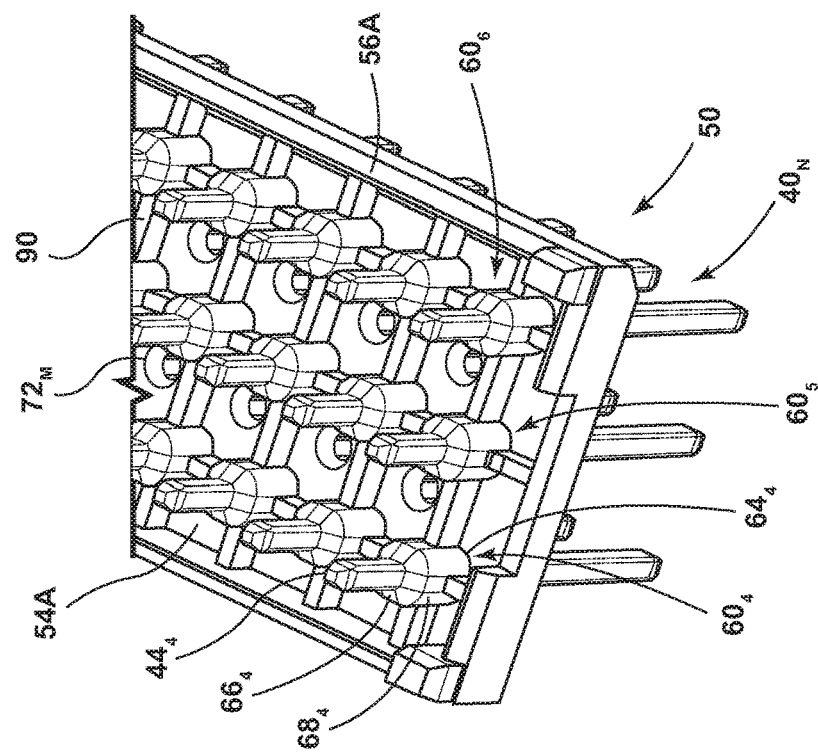
FIG. 5B is a perspective view of an embodiment of a terminal block and electrical terminals in accordance with teachings of the present disclosure.
Figure 5A:
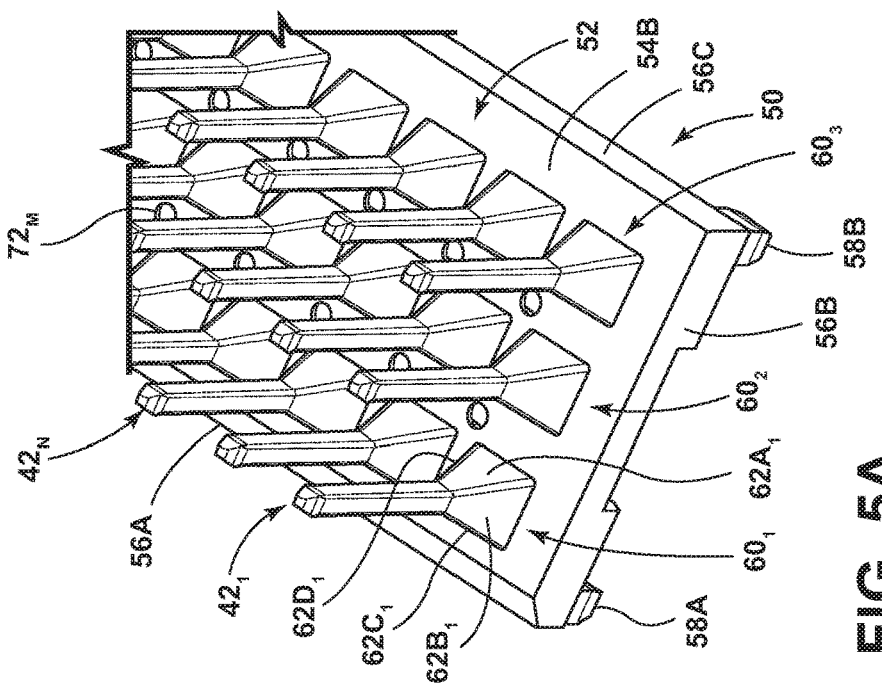
FIG. 5A is a perspective view of an embodiment of a terminal block in accordance with teachings of the present disclosure.

In embodiments, one or more guiding formations $60_N$ (e.g., formations $60_4$, $60_5$, $60_6$) may include a conical configuration (see, e.g., FIGS. 5B, 6A, and 6B). In a conical configuration, a guiding formation $60_N$ may include a generally conical shape with a base $64_N$ disposed at a surface (e.g., lower surface 54A) of body 52 and that narrows as it extends away from body 52. In embodiments, base $64_N$ of a guiding formation $60_N$ in a conical configuration may be generally cylindrical in at least in some areas (e.g., may include at least some aspects of a cylindrical configuration) and the guiding formation $60_N$ may include a tapered section $66_N$ that tapers inward (e.g., like a cone) toward the top of the guiding formation $60_N$. In embodiments, an outer wall $68_N$ of a guiding formation $60_N$ with a conical configuration may be configured to guide second portion $44_N$ into a corresponding aperture $16_N$. In embodiments, guiding formations $60_N$ may provide support to electrical terminals $40_N$ even after insertion is complete.

In embodiments, such as generally illustrated in FIGS. 5A, 5B, 6A, and 6B, terminal block 50 may include guiding formations $60_N$ at upper surface 54B of body 52 (e.g., top guiding formations $60_1$, $60_2$, $60_3$) and/or at lower surface 54A of body 52 (e.g., bottom guiding formations $60_4$, $60_5$, $60_6$). For example, and without limitation, guiding formations $60_N$ disposed at upper surface 54B of body 52 may each include a pyramid configuration and/or guiding formations $60_N$ disposed at lower surface 54A of body 52 may each include a conical configuration.

In embodiments, the length 42A of first portions $42_N$ beyond/above separation formations 24 may be subject to strict tolerances. In embodiments, a height 60A of one or more guiding formations $60_N$ (e.g., top guiding formations $60_1$, $60_2$, $60_3$) may correspond to the height of separation formations 24. In embodiments, such as generally illustrated in FIG. 6A, height 60A of top guiding formations (e.g., formations $60_1$, $60_2$, $60_3$) may be about the same as or shorter than the height 24A of separation formations 24, which may correspond to guiding formations $60_N$ not extending beyond separation formations 24 and/or not affecting the effective length 42A of first portions $42_N$. For example, and without limitation, the height 24A of separation formations 24 may be about 1.5 mm to 2 mm and height 60A of guiding formations $60_N$ (e.g., above upper surface 52B) may be about 1.5 mm to 2 mm or less. In embodiments, the height 24A of separation formations 24 may be larger and/or smaller than 1.5 mm to 2 mm and the height 60A of guiding formations $60_N$ may be adjusted (e.g., larger or smaller) accordingly.

In embodiments, such as generally illustrated in FIGS. 6A, 6B, 7A, and 7B terminal block 50 may or may not include guiding formations $60_N$ at the upper surface 54B of body 52. In embodiments without top guiding formations $60_N$ (see, e.g., FIG. 6B), a section 42B of first portions $42_N$ of electrical terminals $40_N$ between separation formations 24 may not be guided and/or supported other than via thickness 50B of body 52. In such embodiments, thickness 50B of terminal block 50, which may include the combined height/thickness of body 52 and bottom guiding formations $60_4$, $60_5$, $60_6$, may be relatively short, such as, for example, about 2.5 mm. In embodiments with top guiding formations $60_N$ (see, e.g., formation $60_7$ of FIG. 6A), first portions $42_N$ of electrical terminals $40_N$ may be guided and/or supported between separation formations 24. In such embodiments, a height 50A of terminal block 50, including body 52, top guiding formations (e.g., $60_1$, $60_2$, $60_3$, $60_7$) and bottom guiding formations (e.g., $60_4$, $60_5$, $60_6$, $60_8$) may be greater than height 50B, such as, for example, about 4 mm to 4.5 mm. The embodiment generally illustrated in FIG. 7A and the dimensions shown therein are provided as one non-limiting example of a terminal block 50, and the present disclosure is not limited to the embodiment or dimensions shown in FIG. 7A.

In embodiments, such as generally illustrated in FIG. 5B, body 52 may include a lattice-like support structure (e.g., as opposed to the solid structure of solid body 32 of terminal block 30) that may be disposed at the lower surface 54A of body 52 and that may include a plurality of support beams 90 that may be connected between guiding formations $60_N$ and/or side walls 56A, 56B, 56C, 56D. In embodiments, at least some of the support beams 90 may be disposed in one or more generally rectangular configurations.

In embodiments, a cavity 70 may be defined between terminal block 50 and circuit board 10 (see, e.g., FIGS. 6A and 6B). For example, and without limitation, the bottoms of feet (e.g., feet 58A, 58B) may define a plane that may be parallel to and/or coincident with top surface 12 of circuit board 10. In embodiments, cavity 70 may be defined by a lower surface 54A of body 52, the side walls 56A, 56B, 56C, 56D of body 52, and the bottoms of the feet 58A, 58B and/or the top surface 12 of circuit board 10. In embodiments, upon insertion of second portions $44_N$ into circuit board 10, the bottom of bottom guiding formations may be disposed at a distance 74 from circuit board 10.

In embodiments, body 52 may include one or more apertures $72_M$ that may be configured for venting fluids (e.g., fluids 100, 102) from cavity 70, such as during coating of solder of circuit board 10 with a sealing material/fluid 80 (e.g., a varnish). Apertures $72_M$ may be referred to herein as venting apertures $72_M$. In embodiments, apertures $72_M$ may include one or more of a variety of shapes, sizes, configurations, and/or locations. For example, and without limitation, apertures $72_M$ may be generally circular and may be disposed between one or more electrical terminals $40_N$. In embodiments, electrical terminals $40_N$ may be arranged in rows and/or columns, and a row of apertures $72_M$ may be disposed between each row of electrical terminals $40_N$ and/or a column of apertures $72_M$ may be disposed between each column of electrical terminals $40_N$. In embodiments, apertures $72_M$ may be disposed equidistantly from two or more electrical terminals $40_N$. For example, and without limitation, one or more apertures $72_M$ may be disposed equidistantly from four electrical terminals $40_N$. In embodiments, an aperture $72_M$ may be disposed at the center of one or more of the rectangular configurations of support beams 90. In embodiments, increasing the number and/or size of apertures $72_M$ may be desirable (e.g., to allow a greater amount of fluid to be vented from cavity) and the number and/or size of apertures $72_M$ may be maximized to the extent possible while maintaining the structural integrity of terminal block 50.

In embodiments, a method of forming a terminal block 50 may include providing a mold, such as for plastic injection molding. The mold may include various features that may correspond to aspects embodiments of terminal block 50. For example, and without limitation, the mold may include features that correspond to side walls (e.g., side walls 56A, 56B, 56C, 56D), feet (e.g., feet 58A, 58B), guiding formations $60_N$, apertures $72_M$, and/or support beams 90. Electrical terminals $40_N$ may be placed in the mold and plastic may be injected into the mold to form around the electrical terminals $40_N$, which may result in a single, unitary terminal block 50 including body 52, guiding formations $60_N$, and electrical terminals $40_N$. In embodiments, body 52 and guiding formations $60_N$ may be formed first (e.g., via injection molding) and electrical terminals $40_N$ may be inserted and/or pressed into body 52 and/or guiding formations $60_N$.

In embodiments, a method of assembling an electrical junction box 20 may include disposing a terminal block 50 on and/or adjacent to circuit board 10, which may include inserting second portions $44_N$ of electrical terminals $40_N$ into and/or through corresponding apertures $16_N$ in circuit board 10. Upon complete insertion, second portions $44_N$ may extend beyond the bottom surface 14 of circuit board 10 and feet 58A, 58B may be in contact with the top surface 12 of circuit board 10. In embodiments, second portions $44_N$ of electrical terminals $40_N$ may be soldered to circuit board 10. The soldering process may include solder flowing through apertures $16_N$ to the top surface 12 of circuit board 10 (e.g., into cavity 70). In embodiments, a sealing material 80 may be applied to the solder to prevent/reduce wear and/or corrosion. Applying the sealing material 80 may include inserting sealing material 80 into cavity 70 and venting fluid 100 that was originally in cavity 70 out of cavity 70 via venting apertures $72_M$. In embodiments, sealing material 80 may cure over a period of time, and fumes 102 may be vented out of cavity via apertures $72_M$, which may reduce the formation of air pockets and/or air bubbles.

In embodiments, circuit board 10 and/or terminal block 50 may be inserted into housing 22. Inserting terminal block 50 into housing 22 may include inserting first portions $42_N$ of electrical terminals $40_N$ into apertures $26_N$ that may be defined by separation formations 24 of housing 22. Inserting first portions $42_N$ into apertures $26_N$ may include guiding first portions into apertures via guiding formations $60_N$.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," "with embodiments," or "in embodiments," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

What is claimed is:
1. An electrical terminal block, comprising:
  an electrical terminal including a first portion configured for connection with a connector and a second portion configured for connection with a circuit board;

a body configured to support the electrical terminal, wherein the body includes a first side and a second side, and the first side is opposite the second side;

a guiding formation extending from the body and connected to the electrical terminal; and a first support beam and a second support beam, wherein the first support beam is substantially perpendicular to the second support beam;

wherein the first support beam and the second support beam extend from the second side and from the guiding formation.

2. The electrical terminal block of claim 1, wherein the guiding formation is disposed entirely around the first portion of the electrical terminal.

3. The electrical terminal block of claim 2, wherein the guiding formation includes four substantially planar sides that taper toward a top of the electrical terminal.

4. The electrical terminal block of claim 3, wherein the four substantially planar sides are configured to contact a junction box housing and restrict movement of the first portion of the electrical terminal.

5. The electrical terminal block of claim 2, wherein the guiding formation is a lower guiding formation extending from the second side, and the electrical terminal block includes a plurality of upper guiding formations extending from first side.

6. The electrical terminal block of claim 5, including a plurality of other support beams, wherein the lower guiding formation is interconnected with a plurality of other lower guiding formations via the first support beam, the second support beam, and the plurality of other support beams.

7. The electrical terminal block of claim 5, comprising a plurality of electrical terminals, wherein each of the plurality of upper guiding formations is formed around a respective electrical terminal of the plurality of electrical terminals.

8. The electrical terminal block of claim 7, wherein the lower guiding formation extends farther from the second side than the first support beam and the second support beam.

9. The electrical terminal block of claim 1, wherein the guiding formation is disposed entirely around the second portion of the electrical terminal.

10. The electrical terminal block of claim 1, wherein the guiding formation includes a substantially conical configuration.

11. The electrical terminal block of claim 1, including a second guiding formation and a third support beam; wherein the third support beam extends from the second guiding formation and the first support beam extends from the second guiding formation.

12. The electrical terminal block of claim 1, including a sidewall extending perpendicularly from the body.

13. The electrical terminal block of claim 12, including a plurality of feet extending from the body.

14. An electrical junction box comprising the electrical terminal block of claim 1 and a junction box housing, wherein the guiding formation is in contact with a plurality of separation formations of the junction box housing.

15. A method of assembling a junction box, the method comprising;

providing a junction box housing;

providing a circuit board;

providing an electrical terminal block, the electrical terminal block including guiding formations and electrical terminals;

connecting the electrical terminal block with the circuit board to form a circuit board assembly; and, connecting the circuit board assembly with the junction box housing;

wherein connecting the circuit board assembly with the junction box housing includes inserting the guiding formations and the electrical terminals into respective terminal apertures of the junction box housing.

16. The method of claim 15, wherein the guiding formations are disposed at a top side of the electrical terminal block, and the electrical terminal block includes a plurality of bottom guiding formations disposed at a bottom side of the electrical terminal block that extend toward the circuit board.

17. The method of claim 16, wherein the electrical terminal block includes a plurality of support beams extending downward from the electrical terminal block and connecting the bottom guiding formations.

18. The method of claim 15, wherein at least one of the guiding formations includes four substantially planar sides that taper toward a top of a respective electrical terminal.

19. The method of claim 18, wherein the four substantially planar sides contact the junction box housing upon insertion into the respective terminal apertures.

20. The method of claim 15, wherein providing the electrical terminal block includes forming a body of the electrical terminal block and the guiding formations around the electrical terminals to form a monolithic component.

* * * * *